United States Patent
Miller et al.

(10) Patent No.: US 8,248,809 B2
(45) Date of Patent: Aug. 21, 2012

(54) INVERTER POWER MODULE WITH DISTRIBUTED SUPPORT FOR DIRECT SUBSTRATE COOLING

(75) Inventors: David Harold Miller, San Pedro, CA (US); Mark D. Korich, Chino Hills, CA (US); Terence G. Ward, Redondo Beach, CA (US); Brooks S. Mann, Redondo Beach, CA (US)

(73) Assignee: GM Global Technology Operations LLC, Detroit, MI (US)

(*) Notice: Subject to any disclaimer, the term of this patent is extended or adjusted under 35 U.S.C. 154(b) by 933 days.

(21) Appl. No.: 12/198,723

(22) Filed: Aug. 26, 2008

(65) Prior Publication Data

US 2010/0053889 A1     Mar. 4, 2010

(51) Int. Cl.
     *H05K 5/06* (2006.01)
(52) U.S. Cl. ........ 361/752; 361/730; 361/728; 174/520; 174/50.5
(58) Field of Classification Search ........... 361/710, 361/715, 716, 728, 730, 752; 174/50.5, 539
     See application file for complete search history.

(56) References Cited

U.S. PATENT DOCUMENTS

| | | | |
|---|---|---|---|
| 5,016,090 A | 5/1991 | Galyon et al. | |
| 5,353,865 A | 10/1994 | Adiutori et al. | |
| 5,477,008 A * | 12/1995 | Pasqualoni et al. | 174/539 |
| 5,703,761 A * | 12/1997 | Heiss | 361/800 |
| 5,794,684 A | 8/1998 | Jacoby | |
| 5,959,351 A | 9/1999 | Sasaki et al. | |
| 5,966,291 A | 10/1999 | Baeumel et al. | |
| 6,015,008 A | 1/2000 | Kogure et al. | |
| 6,269,864 B1 | 8/2001 | Kabadi | |
| 6,350,949 B1 * | 2/2002 | Boyd | 174/50.5 |
| 6,519,151 B2 | 2/2003 | Chu et al. | |
| 6,552,911 B1 | 4/2003 | Haupt et al. | |
| 6,721,181 B1 | 4/2004 | Pfeifer et al. | |
| 6,736,192 B2 | 5/2004 | Chang | |
| 6,892,796 B1 * | 5/2005 | Nagashima et al. | 165/80.4 |
| 7,019,395 B2 | 3/2006 | Hirano et al. | |
| 7,046,535 B2 * | 5/2006 | Rodriguez et al. | 363/146 |
| 7,096,678 B2 | 8/2006 | Petroski | |

(Continued)

FOREIGN PATENT DOCUMENTS

DE     10 2004 014 911 A1     10/2004

(Continued)

OTHER PUBLICATIONS

German Office Action for German Application No. 10 2009 027 292.5-33 mailed Nov. 29, 2010.

(Continued)

*Primary Examiner* — Dameon Levi
(74) *Attorney, Agent, or Firm* — Ingrassia Fisher & Lorenz P.C.

(57) ABSTRACT

Systems and/or methods are provided for an inverter power module with distributed support for direct substrate cooling. An inverter module comprises a power electronic substrate. A first support frame is adapted to house the power electronic substrate and has a first region adapted to allow direct cooling of the power electronic substrate. A gasket is interposed between the power electronic substrate and the first support frame. The gasket is configured to provide a seal between the first region and the power electronic substrate. A second support frame is adapted to house the power electronic substrate and joined to the first support frame to form the seal.

20 Claims, 4 Drawing Sheets

U.S. PATENT DOCUMENTS

| | | | |
|---|---|---|---|
| 7,295,433 B2 * | 11/2007 | Taylor et al. | 361/689 |
| 7,333,337 B2 | 2/2008 | Kita | |
| 7,355,856 B2 | 4/2008 | Petroski | |
| 7,508,682 B2 | 3/2009 | Badarinarayan et al. | |
| 7,580,261 B2 | 8/2009 | Smith et al. | |
| 7,659,559 B2 * | 2/2010 | Lee | 257/177 |
| 7,760,506 B1 | 7/2010 | Wang et al. | |
| 7,763,811 B2 * | 7/2010 | Wetzel | 174/538 |
| 7,800,220 B2 | 9/2010 | Marz et al. | |
| 7,880,283 B2 * | 2/2011 | Zhuang | 257/678 |
| 7,884,468 B2 | 2/2011 | Mann et al. | |
| 7,940,532 B2 * | 5/2011 | Willing et al. | 361/807 |
| 8,059,418 B2 * | 11/2011 | Blake, III | 361/752 |
| 2003/0053298 A1 | 3/2003 | Yamanda et al. | |
| 2003/0161110 A1 * | 8/2003 | Spasevski et al. | 361/715 |
| 2004/0160731 A1 * | 8/2004 | Yamaguchi | 361/600 |
| 2005/0011212 A1 | 1/2005 | Bistekos | |
| 2007/0097627 A1 | 5/2007 | Taylor et al. | |
| 2007/0240868 A1 | 10/2007 | Wu et al. | |
| 2009/0032937 A1 | 2/2009 | Mann et al. | |
| 2009/0090490 A1 | 4/2009 | Yoshida et al. | |
| 2010/0053889 A1 | 3/2010 | Miller et al. | |
| 2010/0091457 A1 | 4/2010 | Krause | |

FOREIGN PATENT DOCUMENTS

| | | |
|---|---|---|
| DE | 10 2006 006 175 A1 | 8/2007 |
| EP | 0 841 843 B1 | 5/2001 |
| EP | 1 742 264 A2 | 1/2007 |
| JP | 2007-084040 A | 4/2007 |
| WO | 2008/089711 A1 | 7/2008 |

OTHER PUBLICATIONS

U.S. Office Action for U.S. Appl. No. 12/178,489 mailed Jun. 3, 2010.

Beitelmal et al., Effects of Surface Roughness on the Average Heat Transfer of an Impinging Air Jet:, Int. Comm. Heat Mass Transfer, vol. 27., No. 1, pp. 1-12, 2000.

U.S. Utility Office Action for U.S. Appl. No. 12/638,683 mailed Mar. 30, 2011.

Final Office Action, dated Aug. 10, 2011, for U.S. Appl. No. 12/638,683.

German Office Action, dated Mar. 15, 2012, for German Patent Application No. 10 2009 027 292.5.

Notice of Allowance, dated Dec. 30, 2011, for U.S. Appl. No. 12/638,683.

* cited by examiner

INVERTER POWER MODULE WITH DISTRIBUTED SUPPORT FOR DIRECT SUBSTRATE COOLING

STATEMENT REGARDING FEDERALLY SPONSORED RESEARCH OR DEVELOPMENT

The United States government has a paid-up license in this invention and the right in limited circumstances to require the patent owner to license others on reasonable terms as provided by the terms of DE-FC26-07NT43123 awarded by the United States Department of Energy.

TECHNICAL FIELD

Embodiments of the subject matter described herein relate generally to power electronics modules, and more particularly, embodiments of the subject matter relate to inverter power modules suitable for use with direct substrate cooling methods.

BACKGROUND

Many electrical components generate heat as a byproduct when they dissipate electrical energy. Overheating often affects the performance and reliability of electronic components, and thus, electrical devices are routinely cooled to prevent overheating.

In most power electronics applications, heat sinks are used where efficient heat dissipation is desired. Heat sinks absorb and dissipate heat from electrical components by thermal contact. For example, a heat sink may be soldered or mounted to a power electronic substrate to cool the substrate. In higher power applications, the heat sink is often increased in size in order to improve its thermal capacity. Increasing the size of the heat sink results in increased cost, weight, and volume of the respective power electronics module. The increased weight and volume of the power electronics module is undesirable from a packaging perspective. For example, in automotive applications, packaging space under the hood is limited and increasing the weight of the vehicle is undesirable.

Alternative cooling methods may be employed to cool the power electronics substrate. However, the pressure or forces caused by these cooling methods may cause deflection in the power electronic substrate, which may potentially lead to bowing or cracking in the power electronic substrate.

BRIEF SUMMARY

An apparatus is provided for a power module for use in a vehicle. The power module comprises a power electronic substrate and a first plastic frame adapted to house the power electronic substrate. A second plastic frame is adapted to house the power electronic substrate. The first plastic frame and the second plastic frame are adapted to be joined together to support the power electronic substrate. The power electronic substrate is disposed between the first plastic frame and the second plastic frame such that a seal is formed between the first plastic frame and the power electronic substrate when the first plastic frame and the second plastic frame are joined together.

A method is provided for constructing an inverter power module. The method comprises aligning a power electronic substrate between a first plastic support frame and a second plastic support frame. The first plastic support frame and the second plastic support frame are adapted to house the power electronic substrate. The method further comprises compressing the first plastic support frame and the second plastic support frame together to form a seal between the first plastic support frame and the power electronic substrate, and joining the first plastic support frame and the second plastic support frame.

An apparatus is provided for an inverter module. The inverter module comprises a power electronic substrate. A first support frame is adapted to house the power electronic substrate and has a first region adapted to allow direct cooling of the power electronic substrate. A gasket is interposed between the power electronic substrate and the first support frame. The gasket is configured to provide a seal between the first region and the power electronic substrate. A second support frame is adapted to house the power electronic substrate and joined to the first support frame to form the seal.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

In addition, certain terminology may also be used in the following description for the purpose of reference only, and thus are not intended to be limiting. For example, terms such as "upper", "lower", "top", and "bottom" refer to directions in the drawings to which reference is made. Such terminology may include the words specifically mentioned above, derivatives thereof, and words of similar import. Similarly, the terms "first", "second" and other such numerical terms referring to structures do not imply a sequence or order unless clearly indicated by the context.

Technologies and concepts described herein relate generally to power modules adapted for direct substrate cooling. Plastic support frames are adapted to house a power electronic substrate and form a seal about at least a portion of the power electronic substrate to allow direct cooling of an exposed surface of the substrate. Cross supports and/or internal joints may be utilized to provide additional structural rigidity across the surface of the power electronic substrate to allow for direct substrate cooling of the power electronic substrate from one or more sides of the power module as desired.

Referring now to FIGS. 1-4, in an exemplary embodiment, a power module 100 includes, without limitation, a power electronic substrate 102, a first support frame 104, a second support frame 106, and a sealing element 108. It should be understood that FIGS. 1-4 depict a simplified representation of power module 100 for clarity and ease of explanation, and are not intended to limit the scope of the subject matter in any way. In an exemplary embodiment, the power electronic substrate 102 is disposed within an inner region 110 defined by the support frames 104, 106. The sealing element 108 is interposed between the first support frame 104 and the power electronic substrate 102. In an exemplary embodiment, the support frames 104, 106 are adapted to be joined together to form a seal between the power electronic substrate 102 and the support frames 104, 106 and reduce deflection of the power electronic substrate 102 in the presence of direct substrate cooling methods, as described in greater detail below. In a preferred embodiment, the support frames 104, 106 are joined together such that a compressive seal is maintained between the support frames 104, 106 and the power electronic substrate.

In an exemplary embodiment, the power electronic substrate 102 is realized as a direct bonded copper (DBC) substrate. In such an embodiment, the power electronic substrate 102 has an etched copper surface layer having electrical traces and/or connectivity (e.g., electrically hot), a nonconductive middle layer comprising a ceramic material, and another copper surface layer which may or may not be etched or electrically connected (e.g., electrically cold). In alternative embodiments, other suitable substrate materials may be used, such as, for example, direct bond aluminum (DBA), insulated metal substrate (IMS) or bare copper, as will be appreciated in the art. In an exemplary embodiment, the power electronic substrate 102 has an electrically hot surface that includes electrical traces and circuitry for a power inverter, such as insulated-gate bipolar transistors (IGBTs) and other suitable elements. As described below, in an exemplary embodiment, at least a portion of a surface the power electronic substrate 102 is exposed to coolant and/or cooling mechanisms located adjacent and/or proximate to a respective support frame 104, 106.

Figure 1:
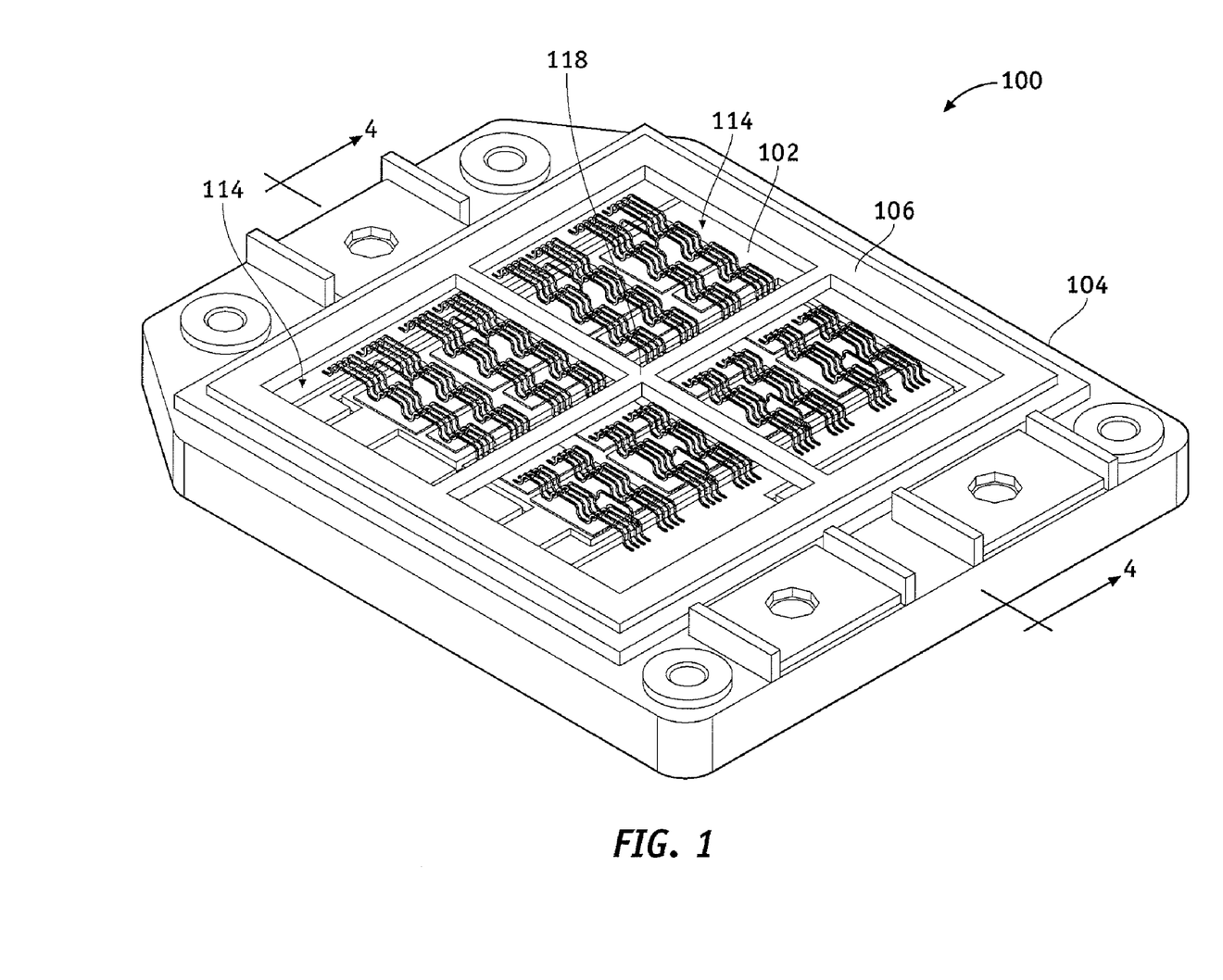
FIG. 1 is a perspective view of an exemplary power module in accordance with one embodiment.
Figure 2:
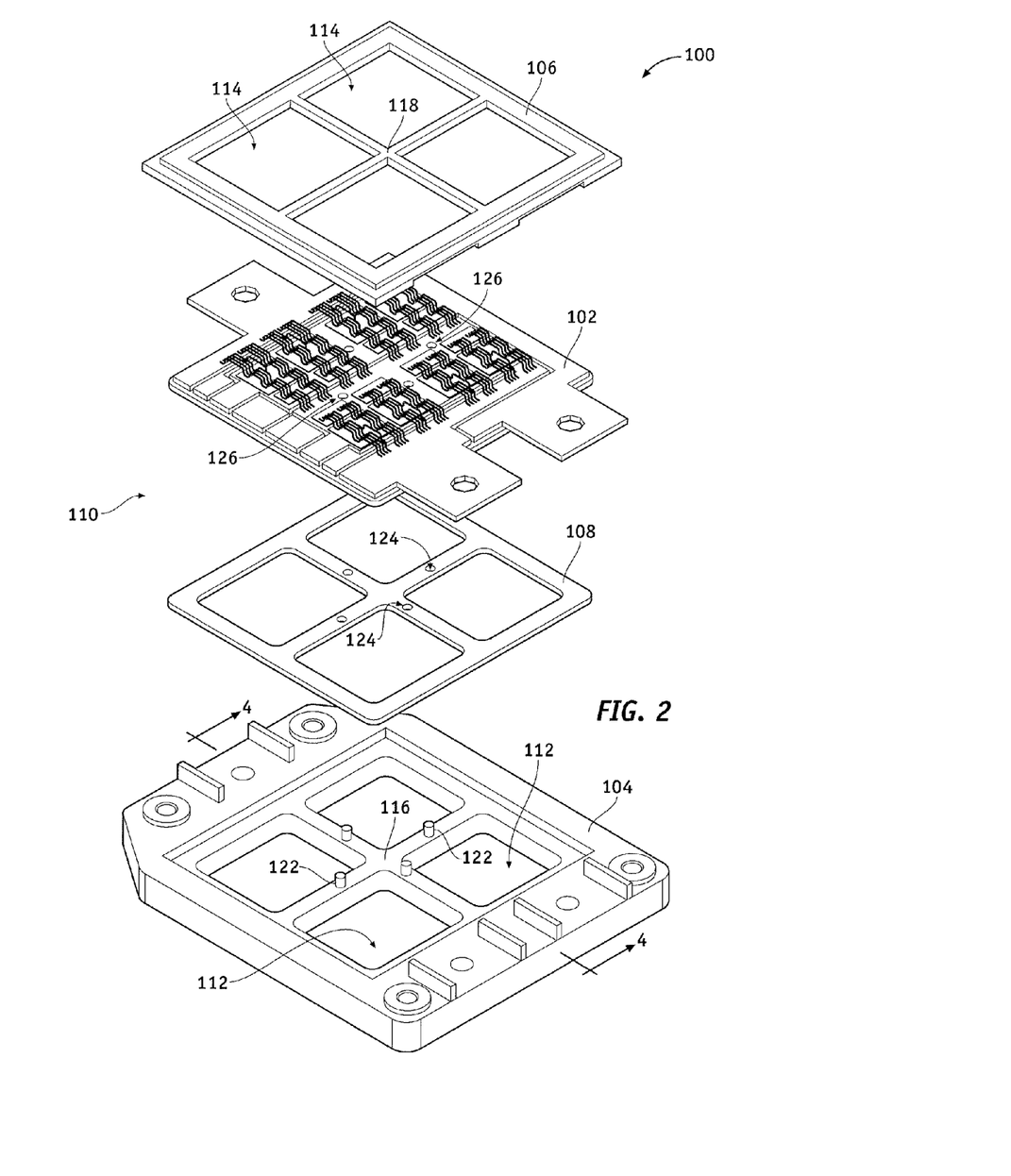
FIG. 2 is an exploded perspective view of the power module of FIG. 1 in accordance with one embodiment.
Figure 3:
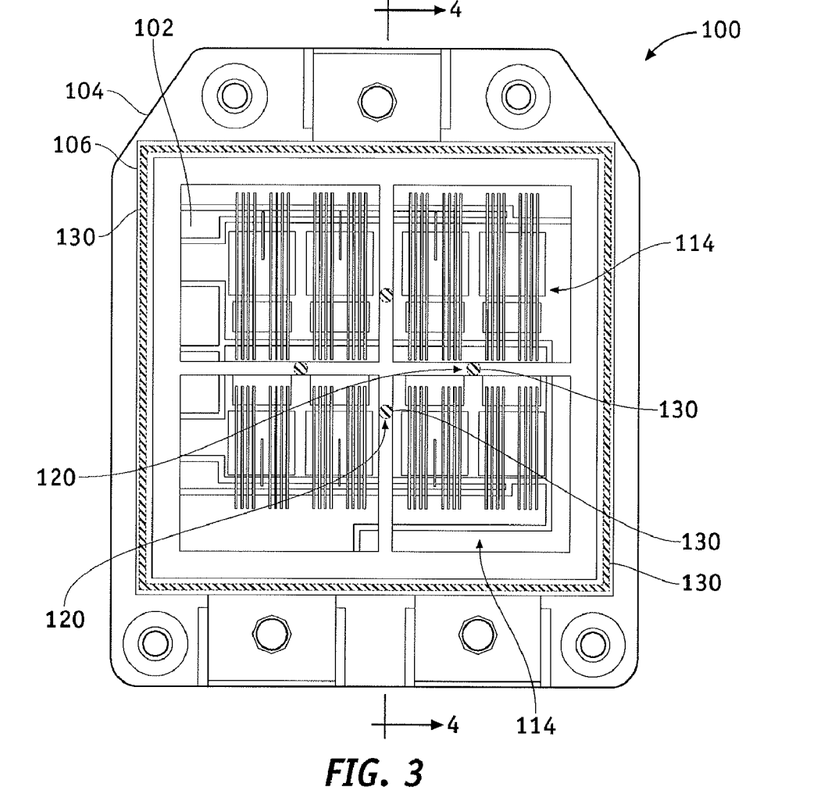
FIG. 3 is a top view of the power module of FIG. 1 in accordance with one embodiment.
Figure 4:
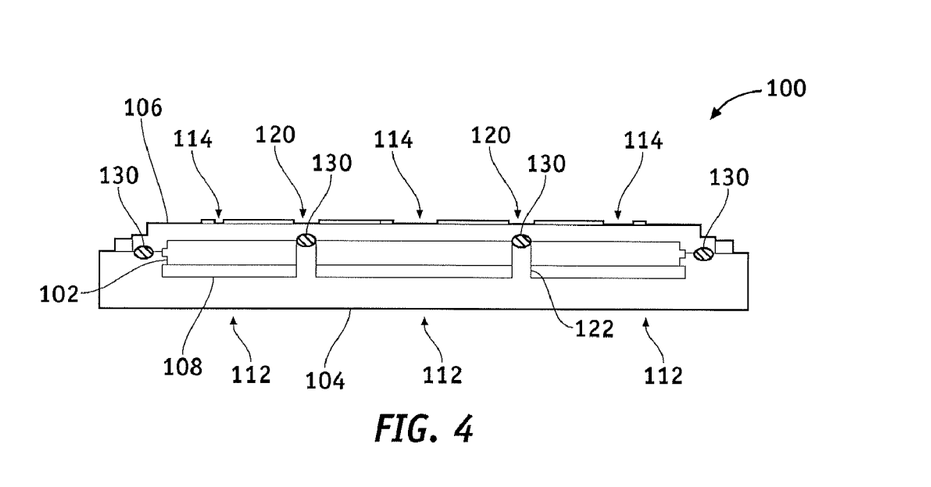
FIG. 4 is a side cross sectional view of the power module of FIGS. 1-3 along the line 4-4 in accordance with one embodiment.

In an exemplary embodiment, the support frames 104, 106 are adapted to house the power electronic substrate 102. In an exemplary embodiment, the support frames 104, 106 are configured such that the inner region 110 houses and/or substantially encloses the power electronic substrate 102 and restricts displacement of the power electronic substrate 102 relative to the support frames 104, 106 when the support frames 104, 106 are joined. As used herein, inner region 110 should be understood as the area or space located between and/or bounded by support frames 104, 106 when the support frames 104, 106 are in contact. For example, as shown in FIG. 2 and FIG. 4, the respective support frame 104, 106 may include a support feature, such as a lip or shoulder formed in the support frame 104, 106, configured to abut the perimeter of the power electronic substrate 102. In an exemplary embodiment, the support frames 104, 106 are realized as injection molded plastic frames adapted to be joined such that the support frames 104, 106 provide mechanical strength for the power module 100 and/or support the power electronic substrate 102. In accordance with one embodiment, the support frames 104, 106 are adapted to be joined by laser welding, as described below.

In an exemplary embodiment, the respective support frames 104, 106 include and/or define exposure regions 112, 114, which are adapted to allow access to and/or direct cooling of portions of the power electronic substrate 102 substantially aligned with the regions 112, 114. The exposure regions 112, 114 may be realized as cutouts or voids in the support frames 104, 106 which allow coolant or direct substrate cooling methods to interface with a surface of the power electronic substrate 102 substantially aligned with the exposure regions 112, 114.

In an exemplary embodiment, the support frames 104, 106 provide structural rigidity across the power electronic substrate 102 to reduce or prevent deflection in the presence of direct substrate cooling methods. In this regard, the respective support frames 104, 106 may include cross supports 116, 118 which intersect the exposure regions 112, 114 to provide additional structural rigidity and distributed support across the power electronic substrate 102. In an exemplary embodiment, the cross supports 116, 118 are formed in the respective support frame 104, 106. For example, in the case of injection-molded plastic support frames 104, 106, the cross supports 116, 118 may be defined in the mold used for the respective support frame 104, 106.

In an exemplary embodiment, the support frames 104, 106 are adapted such that a seal is formed about the exposure regions 112, 114 when the support frames 104, 106 are joined. In an exemplary embodiment, the sealing element 108 is aligned with the exposure region 112 of the first support frame 104 and configured to form a seal between the power electronic substrate 102 and the support frames 104, 106 about exposure regions 112, 114.

In an exemplary embodiment, the sealing element 108 is substantially aligned with the perimeter of the exposure region 112 of the first support frame 104. As best shown in FIG. 2, the sealing element 108 has a generally rectangular outer perimeter that corresponds to a rectangular support feature, such as a shoulder or lip, formed in first support frame 104. It should be understood that although FIGS. 1-4 may be described in the context of generally rectangular features, the subject matter described herein is not limited to any particular geometric arrangement. The sealing element 108 may also include cross members that are substantially aligned with cross supports 116. Depending on the embodiment, the sealing element 108 may be realized as a compression gasket, O-ring, crown seal, liquid gasket, or another suitable mechanical seal capable of containing and/or preventing leakage of a fluid, as will be appreciated in the art. In accordance with one embodiment, the sealing element 108 is formed to be integral with the support frame 104 (e.g., a mold-in-place seal), as described below. It should be understood that although not shown, in alternative embodiments, a second sealing element may be interposed between the power electronic substrate 102 and the second support frame 106 in a similar manner as described herein in the context of sealing element 108. Thus, it will be appreciated that although the power module 100 may be described herein in terms of having an individual sealing element 108 between the first support frame 104 and power electronic substrate 102, such description should be understood as applying in an equivalent manner to alternative embodiments incorporating a second sealing element interposed between the second support frame 106 and the power electronic substrate 102.

In an exemplary embodiment, the power module 100 may be formed by joining the support frames 104, 106 to support and/or encapsulate the power electronic substrate 102. In accordance with one embodiment, the support frames 104, 106 are joined about or proximate to the perimeter of the power electronic substrate 102. The support frames 104, 106 may also be joined at one or more interior points 120 (e.g., along cross supports 116, 118 within exposure regions 112, 114) to provide distributed support across the power electronic substrate 102. In this regard, the first support frame 104 may include one or more pins 122 which protrude through the power electronic substrate 102 and/or sealing element 108 to enable joining the support frames 104, 106 at interior points 120 aligned with the pins 122. In an exemplary embodiment, the power electronic substrate 102 and sealing element 108 include cutout regions or interior voids 124, 126 configured to be aligned with the pins 122. It will be appreciated in the art that the number, shape, and arrangement of pins 122 and/or interior points 120 may vary as desired, and FIGS. 1-4 are not intended to limit the scope of the subject matter in any way.

In an exemplary embodiment, the power module 100 is constructed by aligning the power electronic substrate 102 between the first support frame 104 and the second support frame 106. For example, the interior voids 126 of the power electronic substrate 102 may be aligned with the pins 122 of the first support frame 104. In accordance with one embodiment, the sealing element 108 is also aligned between the first support frame 104 and the power electronic substrate 102 (e.g., by aligning interior voids 124 with pins 122). In an exemplary embodiment, the first support frame 104 and the second support frame 106 are compressed together to form a seal between the support frames 104, 106 and the power electronic substrate 102. The sealing element 108 provides a seal between the first support frame 104 and the power electronic substrate 102 about the exposure region 112 when the first support frame 104 is compressed against the power electronic substrate 102. The reactionary force caused by compressing sealing element 108 may form a flush interface between the power electronic substrate 102 and the second support frame 106. Depending on the type of material chosen for the second support frame 106, this flush interface may also create a seal between the power electronic substrate 102 and the second support frame 106, as will be appreciated in the art. In an exemplary embodiment, the support frames 104, 106 are joined while compressed or under a compressive force such that the seal is maintained indefinitely (e.g., the power module 100 remains in a compressed state).

In an exemplary embodiment, the power module 100 is constructed by joining support frames 104, 106 using a laser welding process. The laser welding process creates bonds 130 (e.g., laser welds) which maintain compressive force on the support frames 104, 106 at locations where the support frames 104, 106 are in direct contact. In this regard, to enable laser welding, the second support frame 106 may be substantially transparent or translucent and the first support frame 104 may be substantially opaque or comprise a darker colored material (e.g., black). In such an embodiment, the first support frame 104 absorbs laser energy directed through the second support frame 106 and/or interior voids 124, 126, such that the laser energy heats the junction of support frames 104, 106 and melts the plastic material in the support frames 104, 106 to form laser welds 130. In this regard, the support frames 104, 106 may be configured to overlap the perimeter of the power electronic substrate 102 for laser welding about the perimeter of the power electronic substrate 102. In alternative embodiments, the bonds 130 may be formed by joining the support frames 104, 106 using ultrasonic welding, friction welding, or other suitable bonding techniques. Alternatively, other means for maintaining pressure on the support frames 104, 106 to create the seal (e.g., a fastener) may be used without bonding the support frames 104, 106 together.

In accordance with one embodiment, a cooling mechanism may be joined to either or both support frames 104, 106 to provide direct cooling to the portions of the surface of the power electronic substrate 102 aligned with exposure regions 112, 114. As used herein, direct cooling should be understood as referring to the processes and/or methods where a coolant is applied to (or alternatively, a flow of coolant is directed at) a surface of the power electronic substrate 102. In this regard, the coolant may be in direct contact with the power electronic substrate 102 without any intervening layers. For example, the cooling mechanism may be joined to support frame 104 and adapted to provide jet impingement cooling to the exposed surface of the power electronic substrate 102 proximate the support frame 104 via exposure region 112. Jet impingement cooling should be understood as referring to the process of providing and/or directing a flow of coolant fluid to the surface of the power electronic substrate 102 using jets. The cooling mechanism may utilize and/or provide a dielectric coolant if cooling an electrically hot surface of the power electronic substrate 102, or otherwise utilizes another suitable coolant (e.g., radiator coolant) if cooling an electrically cold surface of the power electronic substrate 102, as will be appreciated in the art.

Figure 5:
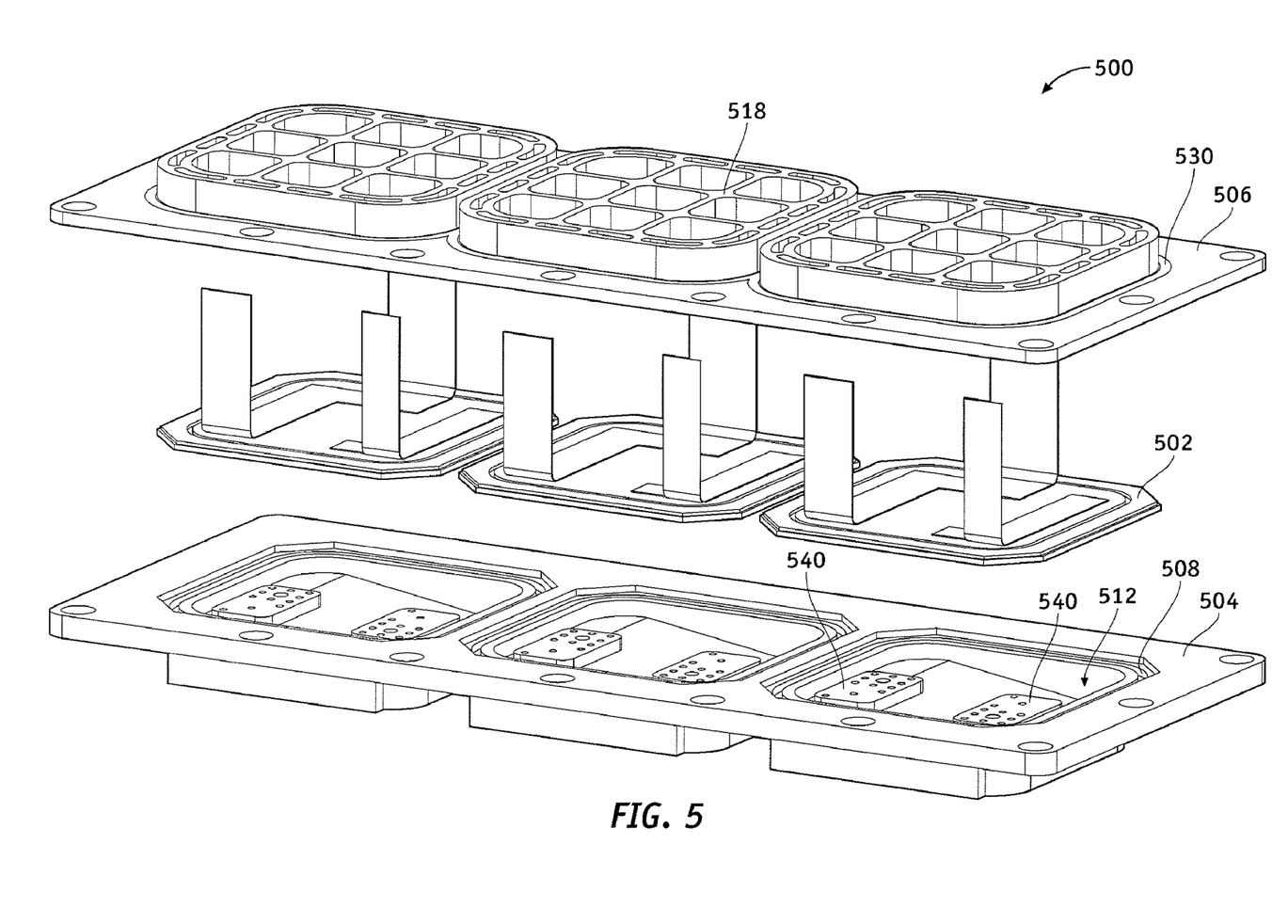
FIG. 5 is an exploded perspective view of an exemplary inverter power module in accordance with one embodiment.

Referring now to FIG. 5, in an exemplary embodiment, an inverter power module 500 may be adapted for direct substrate cooling. The inverter power module 500 includes, without limitation, a power electronic substrate 502, a bottom support frame 504, and a top support frame 506. The elements of the inverter power module 500 are similar to their counterpart elements found in the power module 100 described above with reference to FIGS. 1-4, and these common elements may not be redundantly described in detail here in the context of inverter power module 500.

In an exemplary embodiment, the bottom support frame 504 includes one or more sealing mechanisms 508 integral with the support frame 504 and about the perimeter of one or more exposure regions 512 adapted to allow a portion of the bottom surface of the power electronic substrate 502 aligned with the exposure region 512 to be exposed for purposes of direct substrate cooling. In an exemplary embodiment, the power electronic substrate 502 is disposed between the support frames 504, 506, which in turn are compressed and joined to form a seal between the bottom support frame 504 and the power electronic substrate 502 about the exposure regions 512. In accordance with one embodiment, the support frames 504, 506 are joined by one or more bonds 530 about the perimeter of the exposure regions 512.

In an exemplary embodiment, the bottom support frame 504 includes one or more openings 540 adapted for direct substrate cooling (e.g., jet impingement cooling). A cooling mechanism may be integral with and/or joined to the bottom support frame 504 and aligned such that the cooling mechanism provides coolant to the power electronic substrate 502 through openings 540. In this regard, the cross supports 518 of the top support frame 506 prevent upward deflection (e.g., toward top support frame 506) of the power electronic substrate 502 as a result of the force caused by difference in ambient pressure across the opposing surfaces of the substrate 502. Although not shown, the support frames 504, 506 may be further modified to allow direct substrate cooling from the top of the inverter power module 500 (for example, by adding cross supports to bottom support frame 504), as will be appreciated in the art, and FIG. 5 is not intended to limit the scope of the subject matter in any way.

One advantage of the system and/or method described above is that the power electronic substrate may be cooled without the use of a heat sink. Use of plastic support frames reduces the overall cost and weight of the power module. The plastic support frames may be joined about the perimeter of the power electronic substrate and at interior points to provide structural rigidity across the substrate and prevent deflection in either direction which may otherwise be caused by direct substrate cooling methods. The support frames may be injection molded plastic with integral sealing elements or gaskets, and adapted for laser welding.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power module for use in a vehicle, the power module comprising:
    a power electronic substrate;
    a first plastic frame adapted to house the power electronic substrate; and
    a second plastic frame adapted to house the power electronic substrate, wherein:
        the first plastic frame and the second plastic frame are bonded together about a perimeter of the power electronic substrate; and
        the power electronic substrate is disposed between the first plastic frame and the second plastic frame such that a seal is formed between the first plastic frame and the power electronic substrate when the first plastic frame and the second plastic frame are bonded together.

2. The power module of claim 1, further comprising a first sealing element interposed between the power electronic substrate and the first plastic frame, the first sealing element being configured to form the seal.

3. The power module of claim 2, wherein the first sealing element is integral with the first plastic frame.

4. The power module of claim 1, further comprising a cooling mechanism adjacent to the first plastic frame and configured to provide direct cooling to a surface of the power electronic substrate proximate the first plastic frame.

5. The power module of claim 1, wherein the first plastic frame and the second plastic frame are adapted to be joined at an interior point within the power electronic substrate.

6. The power module of claim 1, wherein the power electronic substrate is a direct bonded copper substrate.

7. The power module of claim 1, wherein the first plastic frame and the second plastic frame are bonded together by laser welds.

8. A method for constructing an inverter power module, the method comprising:
    aligning a power electronic substrate between a first plastic support frame and a second plastic support frame, the first plastic support frame and the second plastic support frame being adapted to house the power electronic substrate;
    compressing the first plastic support frame and the second plastic support frame together to form a seal between the first plastic support frame and the power electronic substrate; and
    joining the first plastic support frame and the second plastic support frame about a perimeter of the power electronic substrate.

9. The method of claim 8, further comprising joining the first plastic support frame and the second plastic support frame at an interior point.

10. The method of claim 8, further comprising joining a cooling mechanism to the first plastic support frame, the cooling mechanism being adapted to provide coolant to a surface of the power electronic substrate proximate the first plastic support frame.

11. The method of claim 8, the first plastic support frame and the second plastic support frame being adapted for laser welding, wherein joining the first plastic support frame and the second plastic support frame comprises laser welding the first plastic support frame and the second plastic support frame together.

12. The method of claim 8, further comprising aligning a sealing element interposed between the first plastic support frame and the power electronic substrate prior to the compressing step, wherein the sealing element forms the seal between the power electronic substrate and the first plastic support frame when the first plastic support frame and the second plastic support frame are compressed.

13. An inverter module comprising:
    a power electronic substrate;
    a first support frame adapted to house the power electronic substrate, the first support frame having a first region adapted to allow direct cooling of the power electronic substrate;
    a gasket interposed between the power electronic substrate and the first support frame, the gasket being configured to provide a seal between the first region and the power electronic substrate; and
    a second support frame adapted to house the power electronic substrate, wherein the first support frame and the second support frame are joined about a perimeter of the power electronic substrate to form the seal.

14. The inverter module of claim 13, the power electronic substrate having a plurality of interior voids, wherein the first support frame and the second support frame are joined at locations aligned with the plurality of interior voids.

15. The inverter module of claim 14, wherein the first support frame includes a plurality of pins configured to protrude through the plurality of interior voids.

16. The inverter module of claim 13, further comprising a cooling mechanism adjacent to the first support frame, the cooling mechanism being configured to provide jet impingement cooling to a surface of the power electronic substrate aligned with the first region.

17. The inverter module of claim 13, the second support frame having a second region adapted to allow direct cooling of the power electronic substrate, wherein the inverter module further comprises a second cooling mechanism adjacent to the second support frame, the second cooling mechanism being configured to provide direct cooling to a surface of the power electronic substrate aligned with the second region.

18. The inverter module of claim 17, further comprising a second gasket interposed between the power electronic substrate and the second support frame, the second gasket being configured to provide a second seal between the second region and the power electronic substrate when the first support frame and the second support frame are joined.

19. The inverter module of claim 13, wherein the power electronic substrate is a direct bonded copper substrate.

20. The inverter module of claim 13, wherein the gasket is integral with the first support frame.

* * * * *